(12) United States Patent
Matsumoto et al.

(10) Patent No.: US 6,791,154 B2
(45) Date of Patent: Sep. 14, 2004

(54) INTEGRATED SEMICONDUCTOR CIRCUIT DEVICE HAVING SCHOTTKY BARRIER DIODE

(75) Inventors: Hironori Matsumoto, Nara (JP); Toshinori Ohmi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 68 days.

(21) Appl. No.: 10/054,823

(22) Filed: Jan. 25, 2002

(65) Prior Publication Data

US 2002/0105046 A1 Aug. 8, 2002

(30) Foreign Application Priority Data

Feb. 2, 2001 (JP) ........................................ 2001-027128

(51) Int. Cl.[7] ............................................ H01L 31/108
(52) U.S. Cl. ...................... 257/486; 257/471; 257/485; 257/280; 257/288
(58) Field of Search ................................ 257/486, 471, 257/485, 280, 281, 288

(56) References Cited

U.S. PATENT DOCUMENTS

| 3,964,084 | A | 6/1976 | Andrews, Jr. et al. |
| 4,662,058 | A | 5/1987 | Cirillo, Jr. et al. |
| 5,225,359 | A | 7/1993 | DeLong |
| 5,323,053 | A | 6/1994 | Luryi et al. |
| 5,731,691 | A | 3/1998 | Noto |
| 5,956,137 | A | 9/1999 | Lim et al. |
| 6,122,494 | A | 9/2000 | Tuttle |
| 6,255,704 | B1 * | 7/2001 | Iwata et al. .................. 257/401 |
| 2001/0005610 | A1 * | 6/2001 | Fukase et al. ............... 438/239 |

FOREIGN PATENT DOCUMENTS

| EP | 0 580 242 A1 | 1/1994 |
| EP | 0 702 316 A1 | 3/1996 |
| EP | 0 831 415 A2 | 3/1998 |
| EP | 0 902 476 A1 | 3/1999 |
| JP | 63-185693 A | 8/1988 |
| WO | WO 00/74126 A1 | 12/2000 |

OTHER PUBLICATIONS

"A New BiCMOS Gate Array Cell with Diode Connected Bipolar Driver" T. Horiuchi, et al, IEEE 1990 Bipolar Circuits and Technology Mtg. pp. 124–127.

"Metal Silicide Schottky Barrier Diodes", C. M. Hsieh IBM Technical Disclosure Bulletin vol. 21. No. 3 Aug. 1978, p. 1026.

"A 0.4–Micron Fully Complementary BiCMOS Technology for Advanced Logic and Microprocessor Applications" Shih Wei Sun, et al., IEDM Dec. 8–11, 1991, pp. 91–85–88.

* cited by examiner

Primary Examiner—Nathan J. Flynn
Assistant Examiner—Pershelle Greene
(74) Attorney, Agent, or Firm—Birch, Stewart, Kolasch & Birch, LLP

(57) ABSTRACT

An integrated semiconductor circuit device comprising a diode bridge circuit formed of a Schottky barrier diode and a periphery circuit formed of a MOS transistor which are formed on a single silicon substrate, wherein a Schottky barrier, which is a component of the Schottky barrier diode, is made of a silicide layer.

5 Claims, 6 Drawing Sheets

INTEGRATED SEMICONDUCTOR CIRCUIT DEVICE HAVING SCHOTTKY BARRIER DIODE

CROSS-REFERENCE TO RELATED APPLICATION

This application is related to Japanese application No. 2001-27128 filed on Feb. 2, 2001, whose priority is claimed under 35 USC §119, the disclosure of which is incorporated by reference in its entirety.

BACKGROUND OF THE INVENTION

1. Field of the Invention

The present invention relates to an integrated semiconductor circuit device, a process of manufacturing the same, an IC module and an IC card.

2. Description of Related Art

A non-contact IC card is provided with an electricity receiving coil and a diode bridge circuit, which allow supply of a power source voltage and transfer of control signals and data between the IC card and a so-called reader/writer without any contact therebetween. In general, the diode bridge circuit used herein is formed of a Schottky barrier diode showing a small forward rise voltage such that a response speed increases.

Japanese Unexamined Patent Publication No. Sho 63 (1988)-185693 discloses an example of the diode bridge circuit. FIG. 5 shows a schematic plane view of the integrated semiconductor circuit device. In FIG. 5, there shown are an N-channel MOSFET 100, a P-channel MOSFET 110, an N-type well power source 120 and a Schottky barrier diode 130 which are formed on a P-type silicon substrate.

FIG. 6 is a schematic section taken along the line III—III in FIG. 5.

On the P-type silicon substrate 51, an N-type well (semiconductor region) 52 and a P-type channel stopper 53 are formed. Thin gate oxide films 54 (regions 54' for forming transistors) and thick field oxide films 55 are formed on the silicon substrate 51 by a common selective oxidation technique, i.e., so-called LOCOS.

Then, gate electrodes 56 of polysilicon are formed on the gate oxide films 54. Using the gate electrodes 56 and the thick field oxide films 55 as a mask, arsenic ions are injected to form source/drain regions 57 of the N-channel MOSFET 100 on the silicon substrate 51 and a well power source 120 in the N-type well 52.

For increasing a breakdown voltage of the Schottky barrier diode against a backward voltage, boron ions are injected to form low concentration $P^-$ diffusion layers 58 in the N-type well 52. Boron ions are injected again to form source/drain regions 59 of the P-channel MOSFET 110 in the N-type well 52 and $P^+$ diffusion layers 59' for the Schottky barrier diode in the $P^-$ diffusion layers 58.

An interlayer insulating film 60 is then deposited on. the entire surface, in which contact holes 61 are formed at desired positions. The contact holes 61 are buried with metal wires 62 made of a thin film of aluminum (Al) or the like, which are subjected to a thermal treatment to form the N-channel MOSFET 100 and the P-channel MOSFET 110, as well as the Schottky barrier diode 130 between the metal wires 62 and the N-type well 52.

However, as the integrated semiconductor circuits of miniaturized design are intended, the electrical connection between the source/drain regions of the MOSFET is established by a technique different from a conventional one and for example, a so-called plug structure using tungsten (W) or the like is required. Further, a silicide layer such as a titanium silicide layer is formed on the surfaces of the source/drain regions and the gate electrodes of the transistor, respectively, for reducing a wiring resistance.

In order to achieve a diode bridge circuit formed of the Schottky barrier diode and a periphery circuit formed of a MOSFET on a single silicon substrate by a process used in accordance with the miniaturization of the integrated semiconductor circuits, i.e., a process of forming a wiring structure different from the conventional one, the Schottky barrier needs to be formed separately from the formation of the wires for the MOSFET.

In other words, the step of forming openings in regions of anode/cathode electrodes of the Schottky barrier diode and the step of depositing metal for forming the Schottky barrier are added, which causes complication and increases costs. For forming the Schottky barrier diode without increasing the steps, required is the Schottky barrier diode having the same structure as that of a contact region of the MOSFET

SUMMARY OF THE INVENTION

According to the present invention, provided is an integrated semiconductor circuit device comprising a diode bridge circuit formed of a Schottky barrier diode and a periphery circuit formed of a MOS transistor which are formed on a single silicon substrate, wherein a Schottky barrier, which is a component of the Schottky barrier diode, is made of a silicide layer.

The present invention further provides a process of manufacturing an integrated semiconductor circuit device comprising a diode bridge circuit formed of a Schottky barrier diode and a periphery circuit formed of a MOS transistor which are formed on a single silicon substrate, the process comprising the steps of: exposing surfaces at desired positions in source/drain regions and a gate electrode of the MOS transistor, as well as in a region for forming a Schottky barrier of the Schottky barrier diode; converting the exposed surfaces to amorphous; forming metal layers capable of reacting to be silicide on the exposed surfaces; subjecting the exposed surfaces and the metal layers to a thermal treatment for silicidation to form silicide layers; and conducting a thermal treatment for reducing a resistance of the silicide layers.

According to the present invention, there is provided an IC module including the above-described integrated semiconductor circuit device.

Still according to the present invention, there is provided an IC card including the above-described IC module.

In summary, the present invention has been achieved to solve the above-mentioned problem. The silicide layers are formed at the desired positions of the source/drain regions and the gate electrodes of the MOSFET as well as of the region for forming the Schottky barrier.

According to the present invention, the Schottky barrier made of the silicide layer is formed simultaneously with the silicide layers formed in self-alignment at the desired positions of the source/drain regions and the gate electrodes of the MOSFET, and both of the silicide layers are connected to the wiring layers via the contact plugs. Accordingly, the transistor and the Schottky barrier diode are formed to have similar structures. Therefore, the step of forming the openings for forming the Schottky barriers after the formation of the plugs in the transistor and the step of patterning the electrodes can be omitted. Further, a high integration is achieved because the barriers are formed in self-alignment. Moreover, occurrence of spikes, which have been generated when the Schottky junction is established between metal and silicon, is inhibited, because the Schottky junction is established between the silicide layer and silicon substrate. Thus, increase in product yield is expected.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

An embodiment of the present invention is detailed with reference to the figures.

Figure 1:
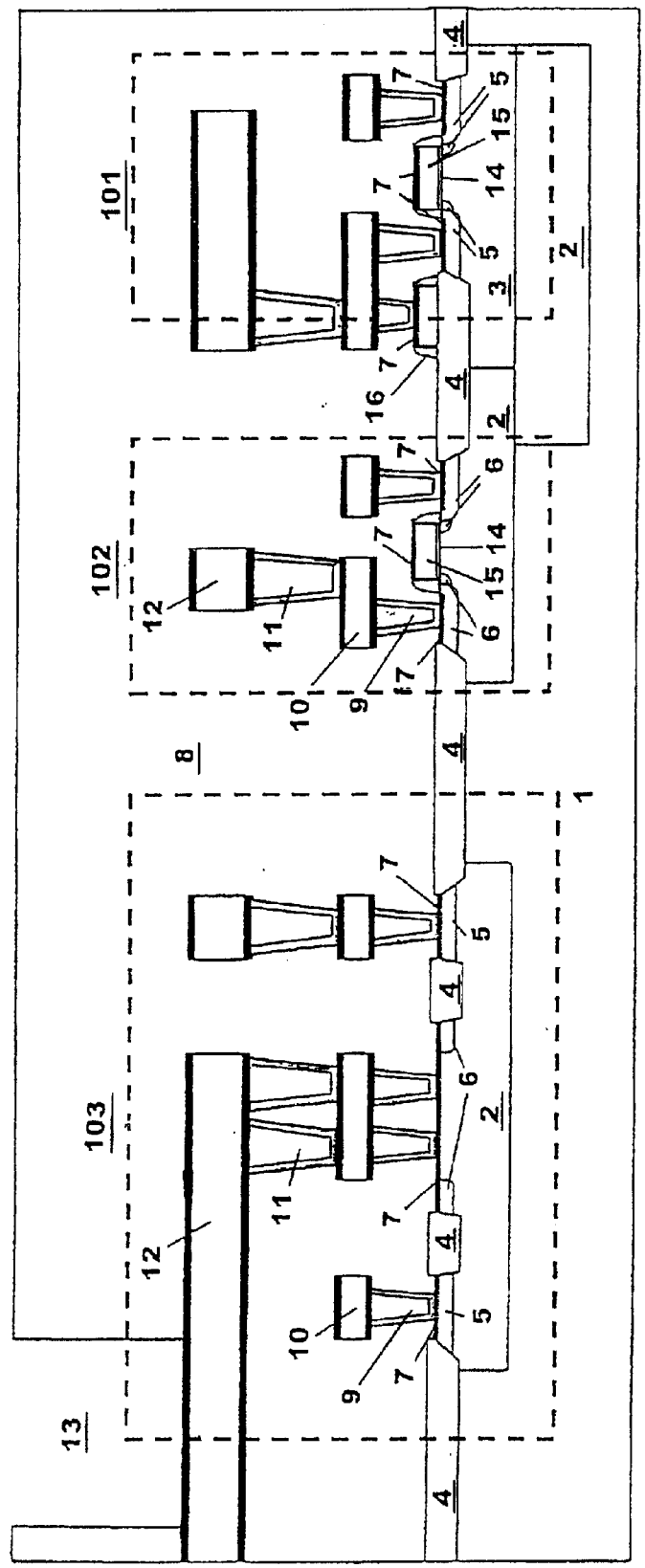
FIG. 1 is a schematic section of an integrated semiconductor circuit device according to the present invention.

FIG. 1 is a schematic section of a major part of an embodiment of an integrated semiconductor circuit device according to the present invention, in which an N-type MOSFET 101, a P-type MOSFET 102 and a Schottky barrier diode 103 are formed. In detail, on a P-type silicon substrate 1, formed are N-type wells 2, P-type wells 3, thick field oxide films 4, high concentration N$^+$ diffusion layers 5, high concentration P$^+$ diffusion layers 6, titanium silicide layers 7, an interlayer insulating film 8, first buried plugs 9, first wiring layers 10, second buried plugs 11, second wiring layers 12 and an electrode pad 13.

As one of the features of the present invention, a Schottky barrier made of a silicide layer (the titanium silicide layer 7) is formed over a region of the high concentration P$^+$ diffusion layers 6 including a portion of the N-type well 2 between them (a region for forming the Schottky barrier) in the Schottky barrier diode 103.

Referring now to FIGS. 2(a) to 2(m), a process of manufacturing the integrated semiconductor circuit device according to the present invention is explained in detail. Since the steps according to the present invention can be carried out with an apparatus and under conditions that have been employed in a conventional process of manufacturing an integrated semiconductor circuit, details thereof are omitted unless they are particular to the present invention.

Figure 2A:
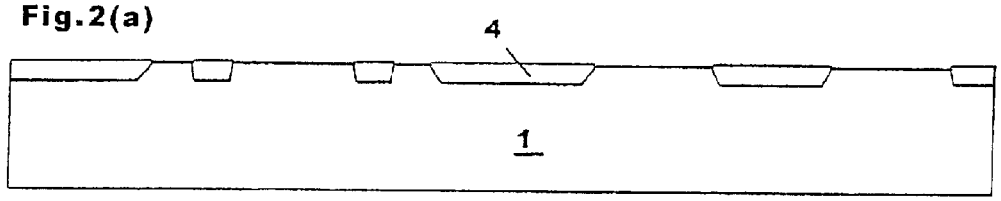
FIGS. 2(a) to 2(m) are views illustrating the steps of manufacturing the integrated semiconductor circuit device according to the present invention.
Figure 2B:
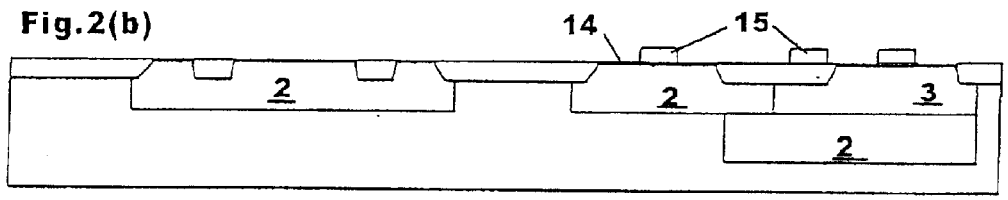
Figure 2C:
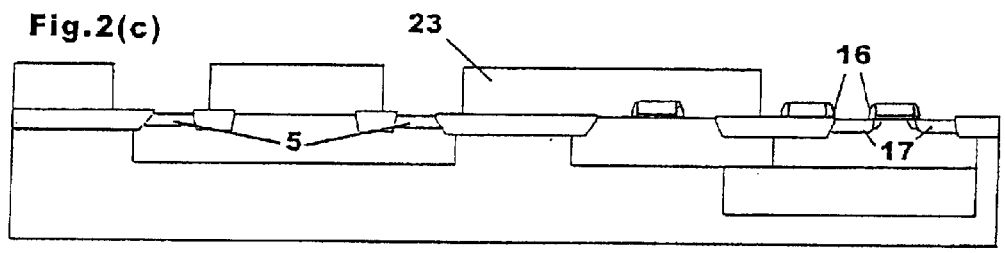

First, field oxide films 4 of about 400 nm thick for device isolation are formed on a surface of a P-type silicon substrate 1 by STI (Shallow Trench Isolation) (FIG. 2(a)).

After forming N-type wells 2 and a P-type well 3, a gate oxide film 14 of about 10 nm and a polysilicon film of about 500 nm are deposited. Then, gate electrodes 15 are formed by photolithography and etching (FIG. 2(b)).

On the sidewalls of the gate electrodes 15, sidewall spacers 16 made of an oxide film are formed. A photoresist 23 is formed to cover desired positions and using the photoresist 23 and the thick field oxide films 4 as a mask, arsenic ions are injected to form source/drain regions 17 for the N-type channel MOSFET and high concentration N$^+$ diffusion layers 5 for the Schottky barrier diode (FIG. 2(c)).

Figure 2D:
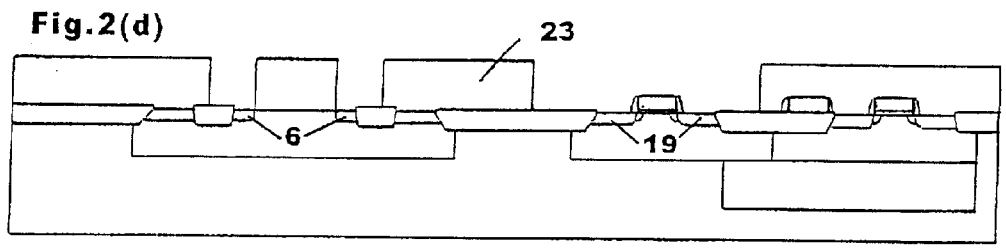

Boron fluoride are injected to form source/drain regions 19 for the P-type channel MOSFET and high concentration P$^+$ diffusion layers 6 for the Schottky barrier diode (FIG. 2(d)).

Then, titanium silicide layers 7 of about 50 nm thick are formed by Saliside (Self align Silicide) on source/drain regions 17 and 19 and the gate electrodes 15 of the MOSFET as well as on anodes 21 and cathodes 22 in the Schottky barrier diode.

The formation of the silicide layer using titanium is described in further detail.

A silicon oxide film on the source/drain regions 17 and 19 and the gate electrodes 15 of the MOSFET and the anodes 21 and the cathodes 22 in the Schottky barrier diode is etched such that a silicon surface is exposed in the above-mentioned regions, respectively.

Figure 2E:
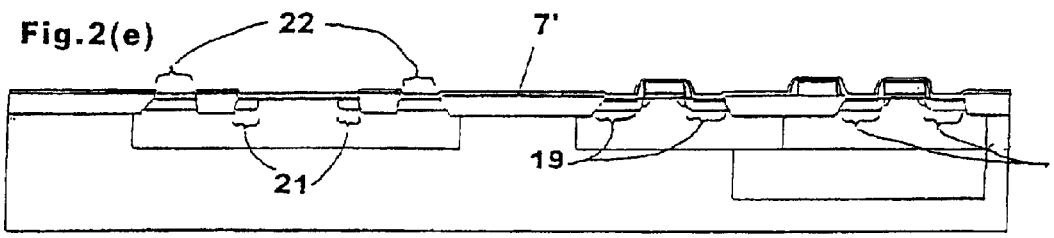

Arsenic ions are injected to convert the thus exposed silicon surfaces into amorphous, and then a titanium layer 7' is deposited to a thickness of about 50 nm by sputtering (FIG. 2(e)). Thermal treatment is carried out under nitrogen atmosphere at about 650° C. for about 40 seconds by RTA (Rapid thermal Anneal), thereby reacting titanium and silicon to form the titanium silicide layer (C49 phase).

Silicidation of metal tends to be influenced by the atmosphere and thus the atmosphere needs to be controlled accurately. An RTA apparatus is suitable for the silicidation because it is a single wafer thermal treatment apparatus having a small chamber for the thermal treatment, which allows the accurate atmosphere control.

Using sulfuric acid and a hydrogen peroxide solution, unreacted titanium layer is removed. Thereafter, thermal treatment at about 850° C. for about 10 seconds is carried out by RTA for reducing the resistance of the titanium silicide layer, thereby changing the phase of the titanium silicide layer to C54.

Figure 2F:
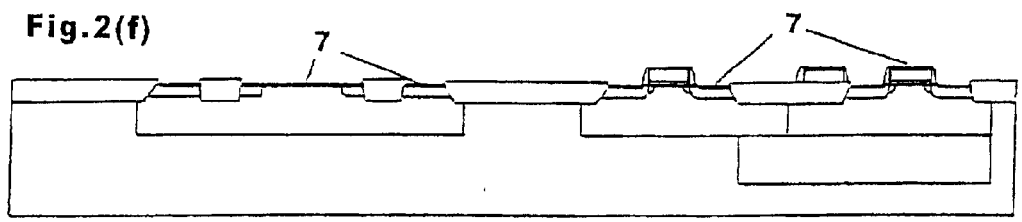
Figure 2G:
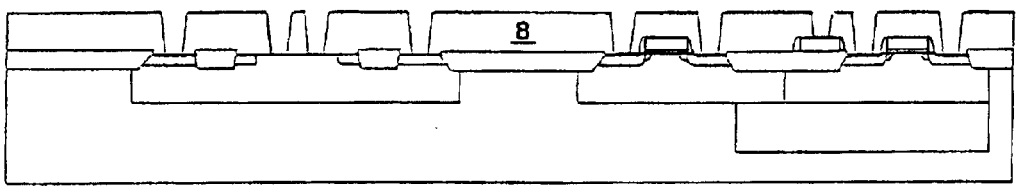
Figure 2H:
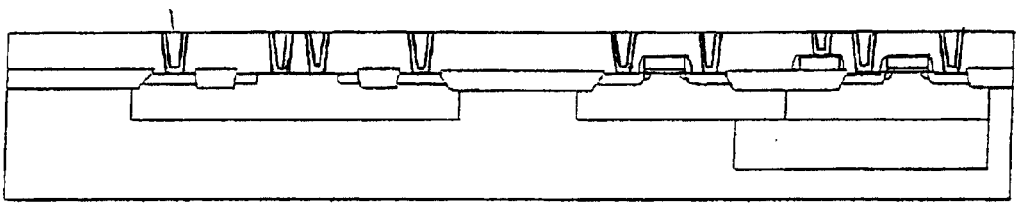
Figure 2I:
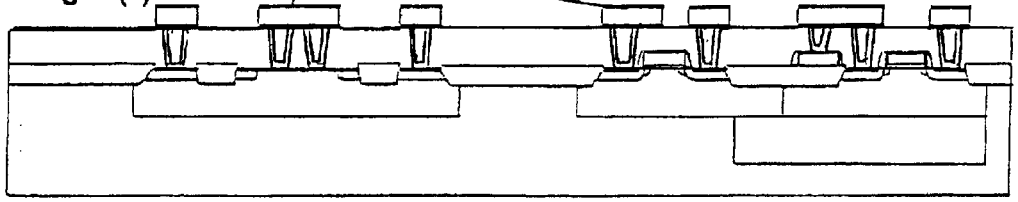
Figure 2J:
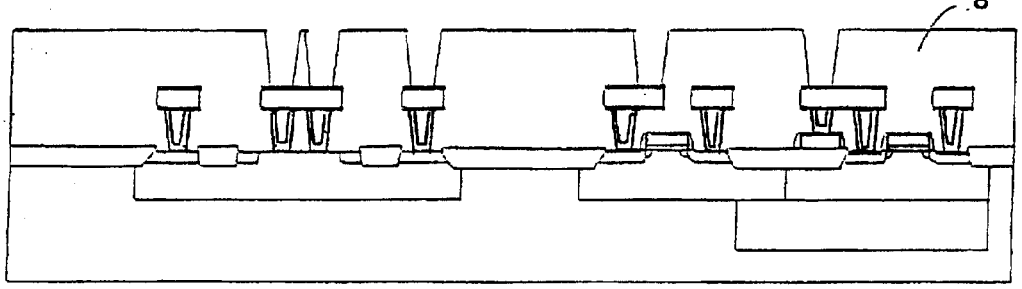

Through the above steps, the titanium silicide layer 7 is simultaneously formed on the source/drain regions 17 and 19 and the gate electrodes 15 of the MOSFET, as well as on the anodes 21 and cathodes 22 of the Schottky barrier diode, respectively (FIG. 2(f)).

Since the cathodes 22 of the Schottky barrier diode is positioned on the high concentration N$^+$ diffusion layers, ohmic junction similar to that of the source/drain regions of the MOSFET is formed and Schottky junction is provided in the anodes.

Although titanium is used for forming the silicide layer in the above explanation, other metals such as tungsten, cobalt, platinum and the like may be used in the same steps as described above.

Then, an interlayer insulating film 8 of an oxide film or the like having a thickness of about 1400 nm is deposited and its surface is etched back by CMP (Chemical Mechanical Polish) by about 500 nm to flatten the surface. Photography and etching are then carried out to form openings in the interlayer insulating film at desired positions of the source/drain regions and the gate electrodes of the transistor and the anodes and cathodes of the Schottky barrier diode (FIG. 2(g)).

Then, a titanium layer of about 60 nm thick, a titanium nitride layer of about 100 nm thick, and a tungsten layer of about 500 nm thick are deposited. Etch back is then carried out to remove the titanium layer, the titanium nitride layer and the tungsten layer from other regions than the openings in the interlayer insulating film, thereby forming first buried plugs 9 (FIG. 2(h)).

A titanium layer of about 30 nm thick, a titanium nitride layer of about 20 nm thick, a Al—Cu layer of about 400 nm thick and a nitride titanium film of about 100 nm thick are deposited. Thereafter, photolithography and etching are carried out to form first wiring layers 10 (FIG. 2(i)).

An interlayer insulating film 8' of an oxide film or the like is deposited to a thickness of about 2000 nm and etched by CMP by about 1000 nm to flatten its surface. Photolithography and etching are then performed to form openings in the interlayer insulating film 8' (FIG. 2(j)).

Figure 2K:
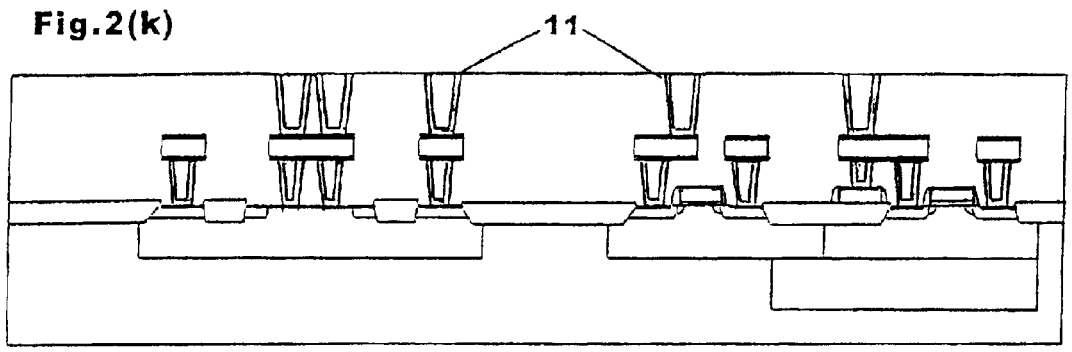

A titanium layer of about 60 nm thick, a titanium nitride layer of about 100 nm thick and a tungsten layer of about 500 nm thick are deposited, followed by performing etch back to remove the titanium layer, the titanium nitride layer and the tungsten layers from other regions than the openings in the interlayer insulating layer, thereby to form second buried plugs 11 (FIG. 2(k)).

Figure 2L:
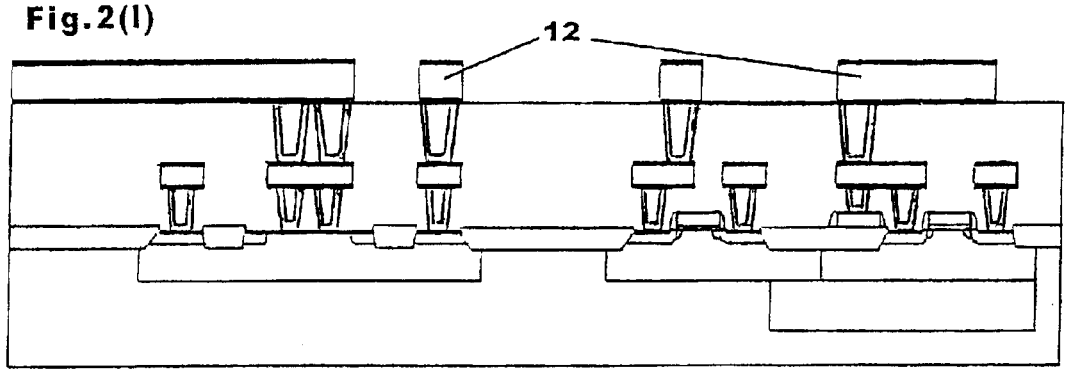

Again, a titanium layer of about 30 nm thick, a titanium nitride layer of about 20 nm thick, a Al—Cu layer of about 400 nm thick and a titanium nitride layer of about 100 nm thick are deposited, followed by photolithography and etching to form second wiring layers 12 (FIG. 2(l)).

Figure 2M:
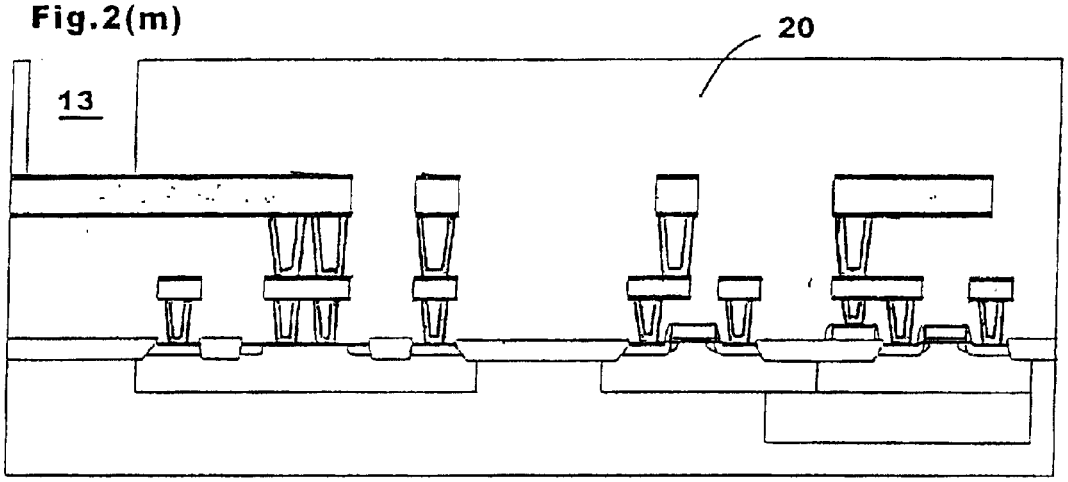

A surface protective film 20 of about 3000 nm thick is then deposited and an electrode pad 13 for external signal transfer is formed (FIG. 2(m)).

With the thus manufactured Schottky barrier diode, a diode bridge circuit can be provided. Since the steps of forming the Schottky barrier diode are included in the steps of forming the electrodes of the MOS transistor, the diode bridge circuit and the periphery circuit (the MOS transistor) are formed on the same silicon substrate without increasing additional steps. Further, since the Schottky junction is established not by directly contacting metal and silicon, but contacting the silicide layer and silicon, a so-called spike effect is not caused. Therefore, increase in product yield can be expected. Moreover, the electrodes are formed in self-alignment, which allows the high integration of the device.

Although the above explanation is directed to the steps of forming the two-layered plugs, it should be understood that single-layered plugs are also within the scope of the present invention.

Figure 3:
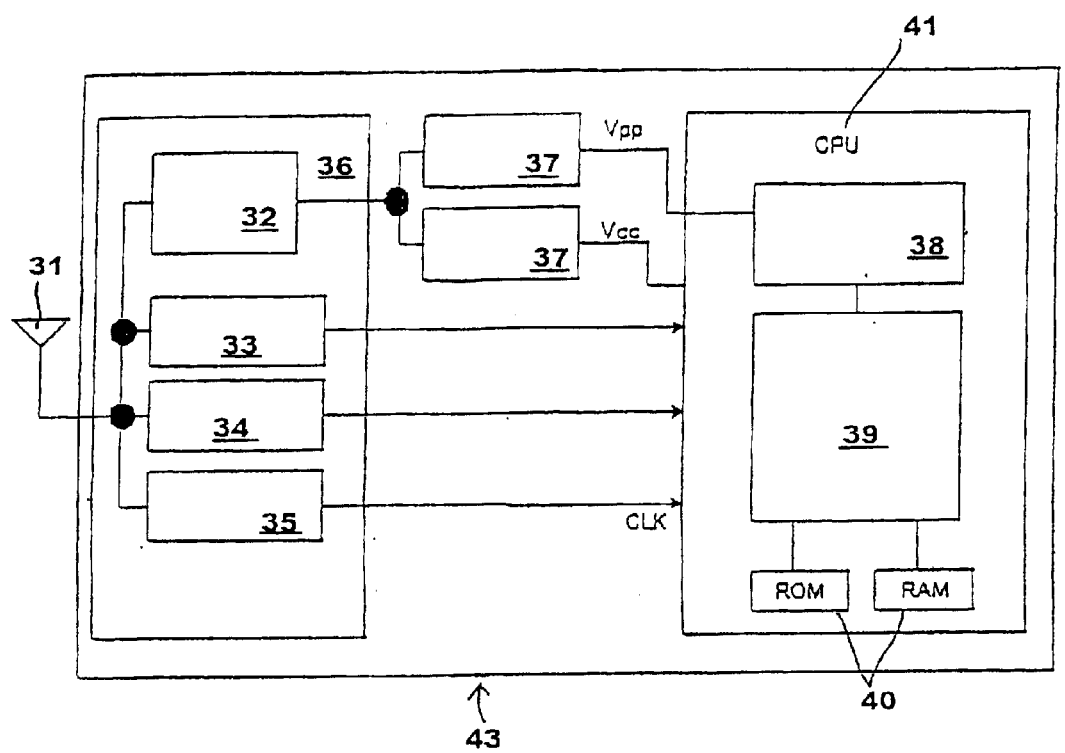
FIG. 3 is a schematic plan view of an IC module according to the present invention.

FIG. 3 shows a circuitry of an IC module utilizing the present invention, wherein the circuitry comprises an antenna 31, a non-contact interface 36, a regulator 37 and a CPU 41. The non-contact interface 36 includes a rectifier circuit 32, a modulator circuit 33, a demodulator circuit 34 and a clock separation circuit 35. The CPU 41, to which electricity is supplied via the rectifier circuit 32 and the regulator 37, includes a flash macro 38, a control circuit 39 and ROM/RAM 40.

The Schottky barrier diode according to the present invention is utilized in the diode bridge circuit in the rectifier circuit 32 of the non-contact interface 36. The structure itself of the diode bridge circuit is the same as that known in the art and thus the explanation of the details thereof is omitted.

Figure 4:
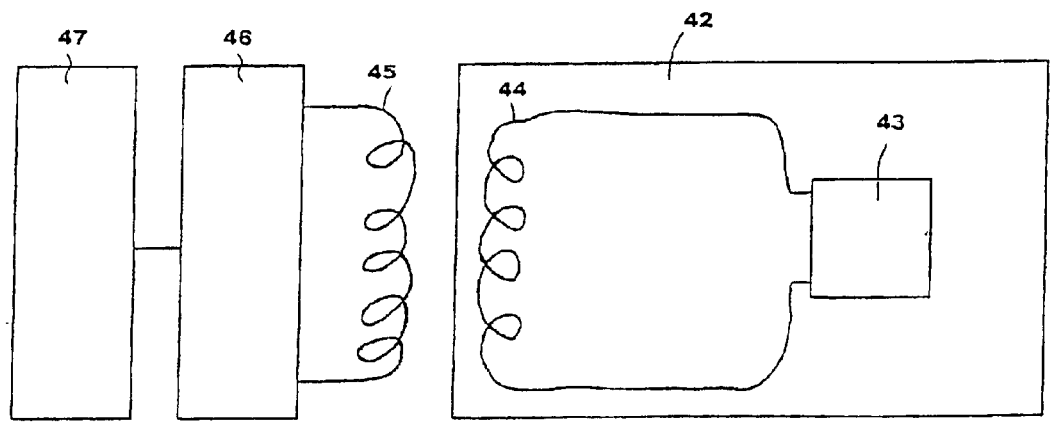
FIG. 4 is a schematic plan view of an IC card according to the present invention.
Figure 5:
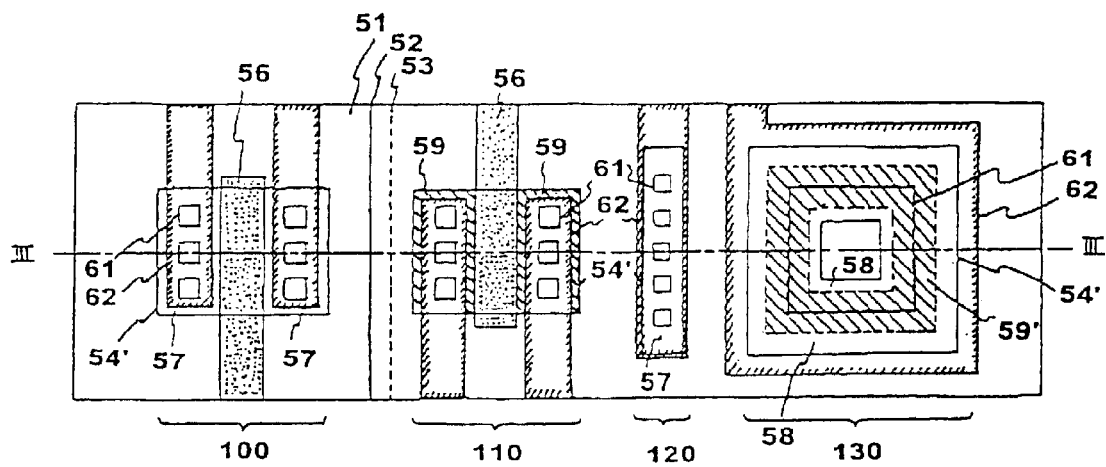
FIG. 5 is a schematic plan view of a conventional integrated semiconductor circuit device.
Figure 6:
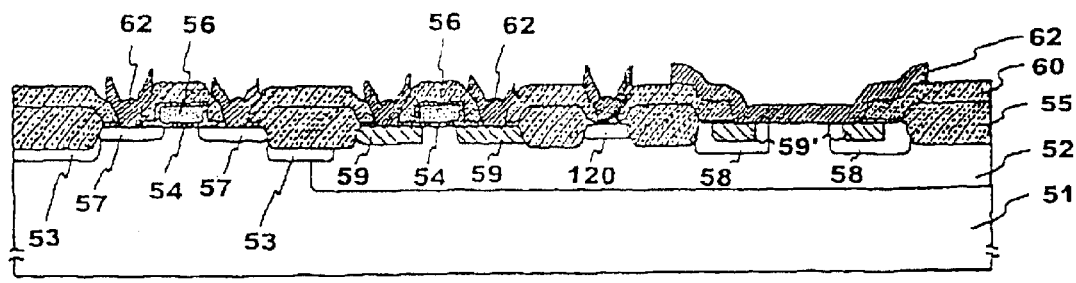
FIG. 6 is a schematic section taken along the line III—III of FIG. 5.

FIG. 4 shows a conceptual view of an IC card 42 including the integrated semiconductor circuit device according to the present invention. The IC card 42 is manufactured by resin molding (not shown) and includes the IC module 43 and the antenna 44 according to the present invention. Between the IC card 42 and a terminal device 47, supply of power source voltage and transfer of control signals and data are carried out via a reader/writer 46 provided with an antenna 45.

As described above, the present invention allows forming the silicide layer functioning as the Schottky barrier simultaneously with the silicide layers formed in self-alignment on the source/drain regions and the gate electrodes of the MOSFET. Even in the Schottky barrier diode, connection to the wiring layers via the contact plugs is established in the same way as in the MOSFET, so that need of forming an opening in a region for forming the Schottky barrier and the step of patterning the barrier are eliminated.

The present invention makes the high integration possible because the barrier is formed in self-alignment. Further, since the Schottky junction is established not by the direct contact between metal and silicon, but by the contact between the silicide layer and silicon, a so-called spike effect does not occur. Accordingly, increase in product yield is expected.

What is claimed is:

1. An integrated semiconductor circuit device comprising a diode bridge circuit formed of a Schottky barrier diode and a periphery circuit formed of a MOS transistor which are formed on a single silicon substrate, wherein a Schottky barrier, which is a component of the Schottky barrier diode, is formed of a silicide layer, another silicide layer is formed on source/drain regions and a gate electrode, which are components of the MOS transistor, and both of the silicide layers are layers formed at the same time in self-alignment of the same materials.

2. A device according to claim 1, wherein the silicide layer is made of titanium silicide, tungsten silicide, cobalt silicide or platinum silicide.

3. A device according to claim 2, wherein the silicide layer shows a C54 phase.

4. An IC module including an integrated semiconductor circuit device according to claim 1.

5. An IC card including an IC module according to claim 4.

* * * * *